United States Patent [19]

Brehm et al.

[11] Patent Number: 4,459,638

[45] Date of Patent: Jul. 10, 1984

[54] ASSEMBLY OF AN EXTERNALLY VENTILATED SEMICONDUCTOR ARRANGEMENT

[75] Inventors: Heinz Brehm, Nuremberg; Adolf Weigand, Rückersdorf, both of Fed. Rep. of Germany

[73] Assignee: SEMIKRON Gesellschaft für Gleichrichterbau und Elektronik, Nuremberg, Fed. Rep. of Germany

[21] Appl. No.: 318,205

[22] Filed: Nov. 4, 1981

[30] Foreign Application Priority Data

Nov. 5, 1980 [DE] Fed. Rep. of Germany ....... 3041656

[51] Int. Cl.³ .............................................. H05K 7/20
[52] U.S. Cl. .................................. 361/384; 165/80 B; 357/82
[58] Field of Search ................... 165/80 B, 80 D, 185; 361/381, 382, 383, 384, 386; 174/16 HS, 15 R, 16 R; 357/81, 82

[56] References Cited

U.S. PATENT DOCUMENTS 4,027,206  5/1977  Lee ........................................ 361/384
4,122,508 10/1978  Rumbaugh ........................... 361/384

FOREIGN PATENT DOCUMENTS 1046199 12/1958  Fed. Rep. of Germany ...... 361/384
2718967 11/1978  Fed. Rep. of Germany .
1438609  6/1976  United Kingdom ............... 361/384

OTHER PUBLICATIONS

Hempelt, "Gleichstrom aus dem Modul", from Elektrotechnik, vol. 58, 2/6/76, pp. 10-12.

Primary Examiner—G. P. Tolin
Attorney, Agent, or Firm—Spencer & Frank

[57] ABSTRACT

A semiconductor circuit arrangement including at least one semiconductor unit provided with a base plate and semiconductor element electrically insulated against the base plate, current conductors connected to the semiconductor unit and a cooling member supporting the semiconductor unit. The arrangement includes a cooling air channel which is divided into a first zone enclosing the cooling member and a second zone enclosing the semiconductor unit and the current conductors connected thereto. A fan is connected for circulating air in the cooling channel. A baffle plate is disposed in the second zone at a distance from the cooling member and is provided with openings for passage of the current conductors. A circuit board for supporting additional circuit elements is disposed to delimit one dimension of the second zone.

17 Claims, 1 Drawing Figure

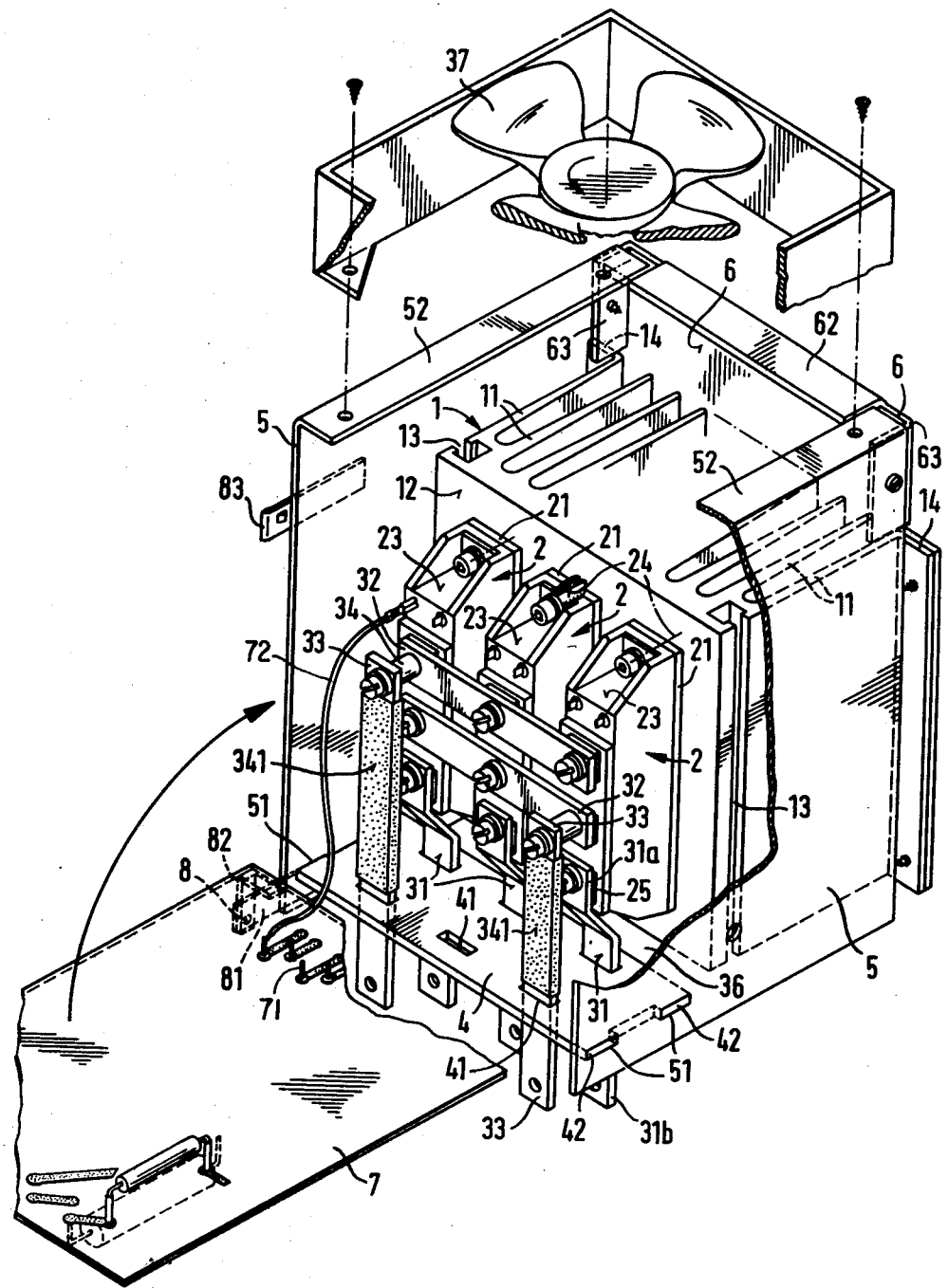

ASSEMBLY OF AN EXTERNALLY VENTILATED SEMICONDUCTOR ARRANGEMENT

BACKGROUND OF THE INVENTION

The invention relates to a semiconductor circuit arrangement.

The periodical "Elektrotechnik" [Electrical Engineering] 58, No. 3, 1976, discloses a semiconductor circuit arrangement in which structural units, called modules, comprising two semiconductor devices are fastened in an axially parallel arrangement on a cooling member produced in an extrusion molding process. Likewise fastened to ribs provided on one of the sides of the cooling member is a plate of insulating material which is equipped with circuit components for the units. A fan dimensioned for the cross section of the cooling member is attached directly to the cooling member. In such arrangements, the spatial association, in particular of the circuit components, may produce difficulties. Moreover, the fan makes an undesirably loud noise. Additionally, the units are not cooled optimally and the spatial positions of the terminals for the units as well as the current conductors connected thereto may be changed in an unfavorable manner by mechanical stresses.

Furthermore, DE-AS No. 2,611,260 discloses a semiconductor circuit arrangement in which cooling member, fan and semiconductor units are arranged as described above and circuit components are attached on further circuit planes formed by rigid conductor elements on the current terminals of the structural units. In these structural designs, an undesirable mutual heating of the units and of the circuit components may occur in addition to the above-mentioned drawbacks. Moreover, exchange and/or maintenance of the units is expensive.

SUMMARY OF THE INVENTION

It is an object of the invention to provide a semiconductor circuit arrangement comprising semiconductor units which include semiconductor elements that are electrically insulated against a common base plate, wherein the arrangement is ventilated externally, has a more economical and compact structure, and is provided with a fan that makes less noise and permits the best possible ventilation for all heat producing components and wherein the current terminals of the semiconductor units and the current conductors connected therewith are secured against changes in their spatial position due to undue mechanical stresses.

The above and other objects are accomplished in accordance with the invention wherein a semiconductor arrangement is provided which includes at least one semiconductor unit provided with a base place against which a semiconductor element is electrically insulated, current conductors connected to the at least one semiconductor unit and a cooling member supporting the at least one semiconductor unit. The arrangement includes a cooling air channel which is divided into a first zone enclosing the cooling member and a second zone substantially enclosing the at least one semiconductor unit and the current conductors connected thereto. A fan is connected for circulating air in the cooling channel. A baffle plate with openings for passage of the current conductors is disposed in the second zone at a distance from the cooling member. Finally, a circuit board for supporting additional circuit elements is disposed in a manner to delimit one dimension of the second zone.

The advantages of the semiconductor circuit arrangement according to the invention reside in the particularly economical design of the accessories for arranging the semiconductor units, in the simple assembly of all components and in the improved distribution of the cooling air as well as in the fact that all circuit components are easily accessible and that any desired permanent connections can be established at the conductors of the semiconductor units without mechanically stressing their current terminals.

BRIEF DESCRIPTION OF THE DRAWING

The sole FIGURE illustrates a perspective view of an embodiment according to the invention showing the mutual spatial association of semiconductor units, cooling member, further circuit elements and conductors disposed in a cooling air channel.

DETAILED DESCRIPTION OF THE PREFERRED EMBODIMENTS

A cooling member 1 is made, for example, of an extrusion molded light metal alloy includes a cover plate 12 and cooling fins 11 which are disposed on one side of the cover plate 12 perpendicularly thereto and parallel to one another. The large-area, planar upper face of the cover plate 12 is provided with two bores (not shown) for fastening each one of three semiconductor units 2 so that their base plates which are electrically insulated from their respective semiconductor units 21 are in an axially parallel arrangement in the direction of flow. A through bore 24 in a recess 23 at each frontal face of semiconductor units 2 is provided for this purpose.

The units 2 are arranged in such a manner that at each unit the alternating current terminal of three series-connected terminals 25 is disposed at the frontal face facing away from the fan. current conductors 31 are fastened to the outermost portions of current terminals 25. The conductors 31 serve as alternating current input leads and preferably extend parallel to one another and in the longitudinal direction of the units. The other two current terminals of the units 2 are each connected, by means of a contact rail 32 extending transversely to the current conductors 31, and form the direct current terminals of the circuit arrangement. For the intended connection of the units 2, each one of the transverse contact rails 32 is firmly connected, via a metal spacer 34, with a current conductor 33 disposed parallel to the conductors 31. According to the drawing, the two conductors 33 are assigned to the two outer units.

The electrical connection of the units 2 via their conductors 31, 33 is therefore effected essentially in the region of the plane of the units on the side of the cooling member 1 provided with the units 2 and at its end facing away from the fan.

In order to realize the required air insulation spacing between the conductors 31, 33, in addition to the provision of the spacers, the conductors may be bent in a suitable manner. As shown in the drawing, the shorter-length section 31a is associated with the current terminal 25 of one unit 2 and, after the bend, the longer section 31b has the required distance from the conductors 33.

To optimally dissipate the heat created in the arrangement, according to the stated object, the units 2 are likewise exposed directly to air cooling. For this purpose, the cooling air channel has two zones, one of which is determined by the cross section of the cooling member 1 and the other zone by the area provided for the units 2 and their current conductors. The smaller portion of the total stream of cooling air generated by the fan will be generated, corresponding to the differences in air resistance in the two zones, between the cooling fins, and the major portion in the region of the units 2.

To prevent an undesirable distribution and to realize predominant cooling in the zone of the cooling member 1, the invention provides that the zone of the cooling air channel associated with the units 2 is at least partially closed at the free end of the cooling member 1 by means of a baffle plate 4. The baffle plate 4 is attached essentially perpendicularly to the cover plate 12 and to the direction of flow of the cooling air as well as at a distance from the cover plate 12. An air gap 36 is thus formed which assures direct air cooling of the semiconductor units 2. Under given operating conditions, the selection of the width of the air gap 36 determines the proportion of cooling air for the units 2. That is, the areal expanse of the baffle plate 4 is determined by the size of the air gap 36. A reference value for the proportional ventilation of the units 2 is the ratio of the air gap area to the air passage area in the cooling member 1.

The baffle plate 4 is provided with slit-like openings 41 whose cross sections correspond to the cross section of the current conductors 31 or 33, respectively, and which serve to provide a fixed arrangement for the current conductors, secure against spatial changes. Accordingly, three openings 41 are provided next to one another in a first plane for the path of the current conductors 31 for the a.c. terminals and further openings 41 in a second plane thereabove are provided for the d.c. terminals. The spacing between the openings 41 and thus between the current conductors is determined by the requirement for sufficient spark-over resistance in air between current carrying conductor portions or their accessories. Moreover, the openings 41 are arranged in a mirror image with respect to the longitudinal and transverse axes of the baffle plate 4 which is of particular advantage for installation of the latter.

The cooling air channel includes two side walls 5 which are each connected with an outer cooling fin 11 of the cooling member 1, a bottom plate 6 which covers the cooling member 1 at the end of the cooling fins 11 and the circuit board 7 which terminates the second zone provided for the semiconductor units 2.

The length of the cooling air channel is defined by the length of the cooling member 1 and by the space provided between the cooling member and the fan. These spatial dimensions essentially determine the areal dimensions of the components of the cooling air channel.

The baffle plate 4 is firmly connected with the side walls 5 at the free end of the cooling air channel, approximately above the transverse edge of the cooling member 1. The side walls 5 are provided in the corresponding edge zone with at least one slit-like recess 51 into which engages a correspondingly shaped extension 42 of the baffle plate 4, with the frontal face of the extension being planar. To simplify assembly of the components 4 and 5, the side walls are each provided with recesses 51 at corresponding locations over the entire length of their edge zones. Thus, the components are interchangeable and warehousing is simplified.

Instead of the stated plug-in connection of the components 4 and 5, a screw-in connection, for example, may also be provided.

Each of the side walls 5 is fastened to the cooling member 1 in a longitudinal groove 13 below the longitudinal edge of the cover plate 12 and is provided with through bores at appropriate places for the establishment of a screw connection. The cooling member 1 and the cooling air channel are given such dimensions that in the intended arrangement of the side walls 5, the longitudinal groove 13 extends coaxially with the longitudinal axis of the side walls 5. This measure likewise simplifies assembly in a particularly advantageous manner. The mutual spatial association of the side walls 5 with the cooling member 1 is determined only by the requirement that the side walls 5, in order to provide for a suitable mechanical connection with the bottom plate 6, extend approximately to the free end of the cooling fins 11.

In the illustrated embodiment, the outer cooling fins 11 of the cooling member 1 are provided with projections 14 intended for the flanged connection to desired systems. The side walls 5 may then be dimensioned in such a manner that their longitudinal edges are seated on the projections 14.

The bottom plate 6 forms the closure for the zone of the cooling air channel defined by the cooling fins 11. As shown in the drawing, the bottom plate 6 is firmly connected with the side walls 5 by means of angled projections 63 which are each attached following the cooling member 1. In a cooling member without the projection 14, the mutual connection of the bottom plate and side walls can be effected with the aid of continuous angular projections (not shown). The type of fastening for these components is not part of the invention.

Moreover, at the side provided for the accommodation of the fan, bottom plate 6 and side walls 5 are provided with angular projections 62 and 52 for the attachment of the fan.

The material for the side walls 5 and for the bottom plate 6 is sheet metal which, if required, may be surface treated. This has the advantage that screw connections can be made by means of self-cutting screws.

The circuit board 7 opposite the bottom plate 6 forms one side wall of the cooling air channel between the fan and the baffle plate 4. At one of its side edges, the circuit board 7 is pivotally fastened with the aid of a swivel joint to one or both side walls 5. In this way, the second zone, in which the semiconductor units and the associated circuit components are disposed, is easily accessible for maintenance work and possibly for additional circuitry measures. According to the illustration, the circuit board 7 is made foldable along one of its narrow sides. The hinge 8 used for this purpose comprises two halves each having an elongate hinge member 81 and an angular hinge member 82. The hinge members of each half are rotatably connected together; each hinge member 81 is fastened to one side wall 5 and each hinge member 82 is fastened at a corresponding location of the circuit board 7. To firmly press each longitudinal edge of the circuit board 7 against the corresponding longitudinal edge of the side wall 5, spring clamps 83 are provided.

At its interior, the circuit board 7 is provided with all the leads required for the connection of circuit components to an external terminal strip as well as the necessary circuit resistors. And its exterior circuit board 7 has the circuit capacitors. The corresponding control lines are flexible.

Further possibilities for fastening the circuit board 7 are a screw connection with a corresponding angular projection on the side walls 5 or quick locks as they are commercially available, such as so-called bayonet locks, twist locks, snap locks and others.

On its exterior, the circuit board 7 may be provided with additional circuit planes produced, for example, with the aid of rigid supporting bolts, for the attachment of further plastic plates as carriers for circuits or circuit components.

To facilitate electrical function testing of circuit components, the circuit board 7 may additionally be provided with continuous contact bolts 71 which, on the interior of the board, are connected with essential contact points of the circuit via electrical leads, such as lead 72 shown in the FIGURE.

In another embodiment of the invention, a member having a U-shaped profile may be provided instead of the side walls 5 and the bottom plate 6 of the cooling air channel. The opposing side walls of this U-shaped member are then connected with U-shaped lugs at the end intended for fastening the fan, and the fan is placed onto these lugs. For fastening of a system, the side of the component intended as the bottom face is provided with appropriate openings in the region between fan and cooling member 1.

In a further embodiment of the invention, the side walls 5 and the bottom plate 6 may be parts of the cooling member 1. For this purpose, the cooling fins 11 extend in the corresponding length beyond the cover plate 12 to define the zone intended for the units 2, and beyond the length of the cooling member 1 so as to form a free space between fan and cooling member 1 and finally below the inner cooling fins for their mutual connection.

I claim:

1. A semiconductor circuit arrangement comprising:
   at least one semiconductor unit provided with a base plate and a semiconductor element electrically insulated from said base plate;
   current conductors connected to said at least one semiconductor unit;
   a cooling member supporting said at least one semiconductor unit;
   a cooling air channel divided into a first zone enclosing said cooling member and a second zone substantially enclosing said at least one semiconductor unit and said current conductors connected thereto;
   a fan connected for circulating air in said cooling air channel;
   a baffle plate having a surface and an edge delimiting the surface, said plate being disposed in said second zone with said surface oriented transverse to the direction of circulating air and said edge disposed at a distance from said cooling member to form a gap between said edge and said cooling member for distributing the circulating air between said first and second zones with at least a portion of the circulating air passing over said at least one semiconductor unit, said plate being further provided with openings through which said current conductors pass; and
   a circuit board supporting additional circuit elements so that the additional circuit elements are exposed to the circulating air within said second zone, with said circuit board being releasably fastened to delimit one dimension of said second zone.

2. A semiconductor circuit arrangement according to claim 1, wherein said cooling member comprises a cover plate and parallel cooling fins attached to one side of said cover plate.

3. A semiconductor circuit arrangement according to claim 1, wherein said cooling member is provided with outer cooling fins each having a flange-like projection at one end thereof.

4. A semiconductor circuit arrangement according to claim 1, wherein said baffle plate has a longitudinal axis of symmetry and a transverse axis of symmetry, and said openings in said baffle plate are arranged in symmetry with both said axes of symmetry.

5. A semiconductor circuit arrangement according to claim 1, wherein said circuit board is provided with conductive paths required for leads and connections of additional circuit elements.

6. A semiconductor circuit arrangement according to claim 1, wherein all heat generating circuit elements are disposed on the interior side of said circuit board.

7. A semiconductor circuit arrangement according to claim 1, wherein said circuit board is provided with through-going contact bolts connected at the interior side of said circuit board with said at least one semiconductor unit.

8. (amended) A semiconductor circuit arrangement according to Claim 1, and further including further circuit components disposed on the exterior of said circuit board in at least one circuit plane above the plane of said circuit board.

9. A semiconductor circuit arrangement according to claim 1, wherein two of said cooling fins are outer fins and are constructed as side walls of said cooling air channel.

10. A semiconductor circuit arrangement according to claim 1, wherein said cooling member is provided with at least two cooling fins; and further comprising continuous side walls each fastened to a respective one of said cooling fins and connected with said circuit board, said side walls enclosing said cooling member in said first zone and enclosing said at least one semiconductor unit and said current conductors connected thereto in said second zone.

11. A semiconductor circuit arrangment according to claim 10, wherein said baffle plate has narrow sides adjacent said side walls provided with cam-shaped extensions, and each said side wall adjacent said cam-shaped extension is provided with matching recesses for engagement of said extensions.

12. A semiconductor circuit arrangement according to claim 10, further comprising swivel joint means connecting said circuit board to at least one of said side walls, and spring clamp means for arresting at least one side of said circuit board firmly against one of said side walls.

13. A semiconductor circuit arrangement according to claim 10, wherein said cooling member is provided with outer cooling fins each having an exterior face with at least one longitudinal groove for fastening a respective one of said side walls.

14. A semiconductor circuit arrangement according to claim 13, wherein each said side wall has a longitudinal axis of symmetry and the length of each said exterior cooling fin and the respective side wall fastened thereto are dimensioned so that said longitudinal axis of symmetry of said side walls is aligned with said longitudinal groove of said exterior cooling fin to which it is fastened.

15. A semiconductor circuit arrangement according to claim 10, further comprising a bottom plate disposed at one end of said cooling fins and connecting together said side walls.

16. A semiconductor circuit arrangement according to claim 15, wherein said side walls and said bottom plate comprise a component having a U-shaped profile, said component having a region disposed between said fan and said cooling member provided with through bores for fastening said arrangement to a support, and a region adjacent said cooling member provided with through bores for fastening components.

17. A semiconductor circuit arrangement according to claim 10, wherein said circuit board is fixed to corresponding ones of said side walls by means of spring clamps.

* * * * *